United States Patent
Jaffe et al.

(10) Patent No.: US 9,917,005 B2
(45) Date of Patent: Mar. 13, 2018

(54) SEMICONDUCTOR STRUCTURE WITH AIRGAP

(71) Applicant: INTERNATIONAL BUSINESS MACHINES CORPORATION, Armonk, NY (US)

(72) Inventors: Mark D. Jaffe, Shelburne, VT (US); Alvin J. Joseph, Williston, VT (US); Qizhi Liu, Lexington, MA (US); Anthony K. Stamper, Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/437,736

(22) Filed: Feb. 21, 2017

(65) Prior Publication Data

US 2017/0170056 A1    Jun. 15, 2017

Related U.S. Application Data

(63) Continuation of application No. 15/083,793, filed on Mar. 29, 2016, now Pat. No. 9,666,475, which is a continuation of application No. 14/480,215, filed on Sep. 8, 2014, now Pat. No. 9,349,793.

(51) Int. Cl.
*H01L 21/762* (2006.01)
*H01L 21/306* (2006.01)
*H01L 29/06* (2006.01)

(52) U.S. Cl.
CPC .. *H01L 21/76289* (2013.01); *H01L 21/30604* (2013.01); *H01L 21/76286* (2013.01); *H01L 29/0649* (2013.01)

(58) Field of Classification Search
CPC ........... H01L 21/76289; H01L 29/0649; H01L 21/30604; H01L 21/76286
See application file for complete search history.

(56) References Cited

U.S. PATENT DOCUMENTS

| | | | | |
|---|---|---|---|---|
| 5,972,758 | A * | 10/1999 | Liang | H01L 21/762 257/E21.433 |
| 6,225,140 | B1 * | 5/2001 | Liu | G01L 9/0042 438/48 |
| 6,800,518 | B2 | 10/2004 | Bendemagel et al. | |

(Continued)

OTHER PUBLICATIONS

Saarnilehto et al., "Local buried oxide technology for HV transistors integrated in CMOS," 19th International Symposium on Power Semiconductor Devices and IC's, May 27-30, 2007, pp. 81-84.

(Continued)

*Primary Examiner* — Kyoung Lee
(74) *Attorney, Agent, or Firm* — Steven J. Meyers; Andrew M. Calderon; Roberts Mlotkowski Safran Cole & Calderon, P.C.

(57) ABSTRACT

A field effect transistor (FET) with an underlying airgap and methods of manufacture are disclosed. The method includes forming an amorphous layer at a predetermined depth of a substrate. The method further includes forming an airgap in the substrate under the amorphous layer. The method further includes forming a completely isolated transistor in an active region of the substrate, above the amorphous layer and the airgap.

9 Claims, 6 Drawing Sheets

(56) References Cited

U.S. PATENT DOCUMENTS

| | | | |
|---|---|---|---|
| 7,015,147 B2 | 3/2006 | Lee et al. | |
| 7,084,028 B2 | 8/2006 | Fukuzumi | |
| 7,166,488 B2 | 1/2007 | MacDonald et al. | |
| 7,906,381 B2 | 3/2011 | Loubet et al. | |
| 8,106,468 B2 | 1/2012 | Wang et al. | |
| 8,546,910 B2 | 10/2013 | Yin et al. | |
| 8,999,849 B1 * | 4/2015 | Lin | H01L 29/2003 438/704 |
| 9,349,793 B2 | 5/2016 | Jaffe et al. | |
| 2004/0058506 A1 * | 3/2004 | Fukuzumi | H01L 21/764 438/422 |
| 2010/0013015 A1 | 1/2010 | Snyder | |
| 2010/0187602 A1 | 7/2010 | Woolsey et al. | |
| 2012/0261771 A1 | 10/2012 | Vega et al. | |
| 2013/0256784 A1 | 10/2013 | Vellianitis et al. | |
| 2016/0093523 A1 | 3/2016 | Jaffe et al. | |
| 2016/0211167 A1 | 7/2016 | Jaffe et al. | |

OTHER PUBLICATIONS

Cheng et al., "Single-chip field effect transistor (FET) switch with silicon germanium (SiGe) power amplifier and methods of forming," U.S. Appl. No. 14/147,186, filed Jan. 3, 2014, 38 pages.

List of IBM Patents or Patent Applications Treated as Related 1 page.

* cited by examiner

SEMICONDUCTOR STRUCTURE WITH AIRGAP

FIELD OF THE INVENTION

The invention relates to semiconductor structures and, more particularly, to a field effect transistor (FET) with an underlying airgap and methods of manufacture.

BACKGROUND

RF switches are significantly easier to make on silicon on insulator (SOI) substrates than on bulk substrates because all junctions are bounded by oxide (STI laterally and the buried oxide below) which eliminates the problem of dropping large voltages across well to substrate junctions. SOI also has low junction capacitances which reduces loading on RF signals. However, it is often advantageous to integrate an RF switch into a bulk process. This can be done with a triple well and very high resistivity substrates, but is a challenge as the RF voltages still must be dropped across a junction, and the large depletion layers in high resistivity substrates add substantial area to the layout.

SUMMARY

In an aspect of the invention, a method comprises forming an amorphous layer at a predetermined depth of a substrate. The method further comprises forming an airgap in the substrate under the amorphous layer. The method further comprises forming a completely isolated transistor in an active region of the substrate, above the amorphous layer and the airgap.

In an aspect of the invention, a method comprises forming at least one deep trench structure in a bulk substrate, on sides of an active region. The method further comprises forming sidewall structures on sidewalls of the at least one deep trench structure, which acts as an etch stop layer. The method further comprises forming a lateral undercut in the bulk substrate starting at a bottom of the at least one deep trench structure. The method further comprises filling the at least one deep trench structure with material to form an airgap from the lateral undercut in the bulk substrate under the active region.

In an aspect of the invention, a structure comprises: an amorphous layer under an active region of a substrate; an airgap in the substrate under the amorphous layer; and a completely isolated transistor in the active region, above the amorphous layer and the airgap and surrounded by shallow trench isolation regions.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
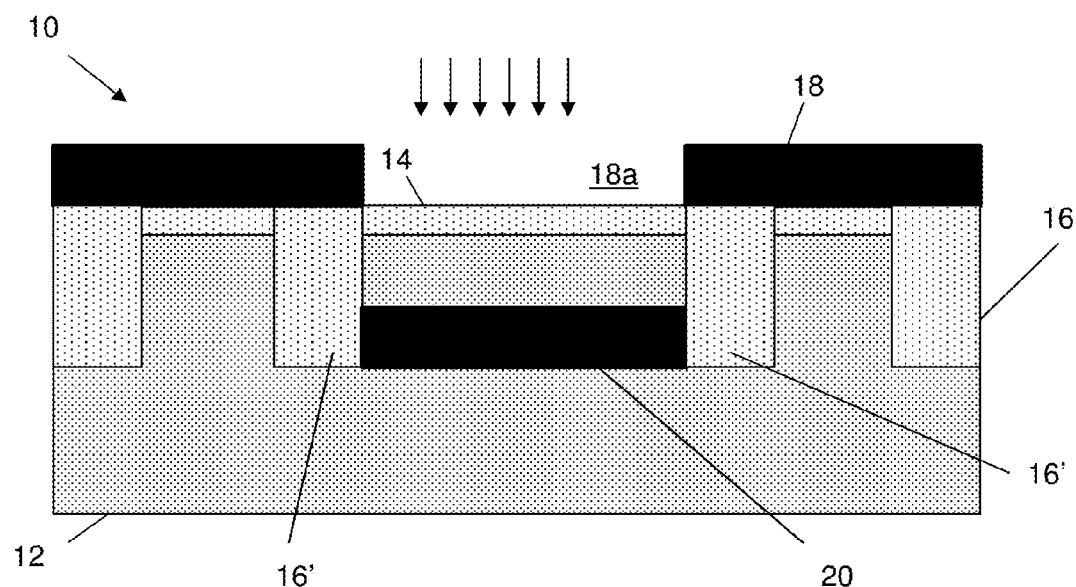
FIGS. 1-4 show respective structures and fabrication processes according to an aspect of the present invention.

The invention relates to semiconductor structures and, more particularly, to a field effect transistor (FET) with an underlying airgap and methods of manufacture. In more specific embodiments, the present invention is directed to an RF switch FET manufactured in bulk technology with an airgap underneath its transistor channel. In embodiments, the present invention provides a completely isolated, e.g., oxide isolated, switch FET integrated onto the bulk process.

In embodiments, the FET is a bulk CMOS transistor with an underlying airgap. The location of the airgap, e.g., top of the airgap, is determined by an etch barrier directly under and in contact with the transistor channel and source and drain regions. In embodiments, the etch barrier layer is an amorphous layer formed by an ion implantation process. In further embodiments, the location of the sides and/or the bottom of the airgap can be determined by the etch barrier layer. The airgap, on the other hand, can be formed by $NH_4OH$ wet etch of silicon, where the etch access to the silicon is from a top surface opening. In alternative embodiments, the etch access to the silicon is from the bottom of a deep trench which has sidewall spacers, and the airgap is formed by $XeF_2$ dry etch of silicon.

Advantageously, the structures of the present invention fully isolate the FET so that there is no junction which connects the transistor to the substrate. The FET of the present invention is also integrated into standard bulk silicon processing without disturbing adjacent elements. Additionally, the present invention eliminates the problem of dropping large voltages across well to substrate junctions in bulk technologies, as well as the problem of large depletion layers in high resistivity substrates which add substantial area to the layout.

The FET of the present invention can be manufactured in a number of ways using a number of different tools. In general, though, the methodologies and tools are used to form structures with dimensions in the micrometer and nanometer scale. The methodologies, i.e., technologies, employed to manufacture the level translator of the present invention have been adopted from integrated circuit (IC) technology. For example, the structures of the present invention are built on wafers and are realized in films of material patterned by photolithographic processes on the top of a wafer. In particular, the fabrication of the level translator of the present invention uses basic building blocks, including: (i) deposition of thin films of material on a substrate, (ii) applying a patterned mask on top of the films by photolithographic imaging, and (iii) etching the films selectively to the mask.

FIGS. 1-4 show respective structures and fabrication processes according to aspects of the present invention. More specifically, in FIG. 1, the structure 10 includes a BULK substrate 10. In embodiments, the BULK substrate 12 is a silicon substrate which can be approximately 350 microns in thickness; although other dimensions are also contemplated by the present invention. A barrier layer 14 is formed on the substrate 12. In embodiments, the barrier layer 14 can be a Silicon Nitride material, which is deposited using conventional deposition processes, e.g., chemical vapor deposition (CVD) process. Shallow trench isolation (STI) structures 16 are formed in the substrate 12, through the barrier layer 14.

In embodiments, the STI structures 16 can be formed from oxide, and fabricated using conventional photolithography, etching, deposition and polishing processes. For example, in embodiments, a photoresist can be formed on the barrier layer 14, which is exposed to energy (e.g., light) in order to form a pattern. Through conventional etching processes, e.g., reactive ion etching (RIE), a corresponding pattern (vias) is formed in the substrate 12 and barrier layer 14. The photoresist is then removed using conventional processes, e.g., oxygen ashing processes. An oxide or other insulator material is then deposited within the opening(s) and any residual material is removed from the surface of the barrier layer 14 using, e.g., a chemical mechanical process (CMP).

Still referring to FIG. 1, a photoresist 18 is formed on the barrier layer 14 and the STI structures 16. The photoresist 18 is patterned to form an opening 18a between adjacent STI structure(s) 16'. An ion implant process (as representatively shown by the arrows in FIG. 1) is then performed to create an amorphous layer 20 at a certain depth of the silicon layer 12, abutting the STI structure(s) 16'. The amorphous layer 20 is formed below the channel, e.g., active region, of transistors which will be formed in later fabrication processes. In embodiments, the implant process can be Ar or Ge or other species, e.g., Boron, which will form an amorphous layer 20 from the single crystalline substrate 12, e.g., silicon substrate.

In embodiments, the amorphous layer 20 is bounded by the STI structure(s) 16' and has a depth of about 500 Å to about 2000 Å; although other depths are contemplated by the present invention as determined by the energy level of the ion implantation process. It should be understood by those of skill in the art that the depth of the amorphous layer 20 may be a function of the transistor, e.g., in order to provide sufficient space for a transistor channel, and based on the energy level of the ion implantation process. A typical amorphising dose for Ar or Ge will be about $2 \times 10^{13}$ to $1 \times 10^{15}$ ions per square cm. On the other hand, the dosage of the ion implantation process will determine the quality of the amorphous layer 20. Both the dosage and energy level can be selected using known look-up tables.

Figure 2:
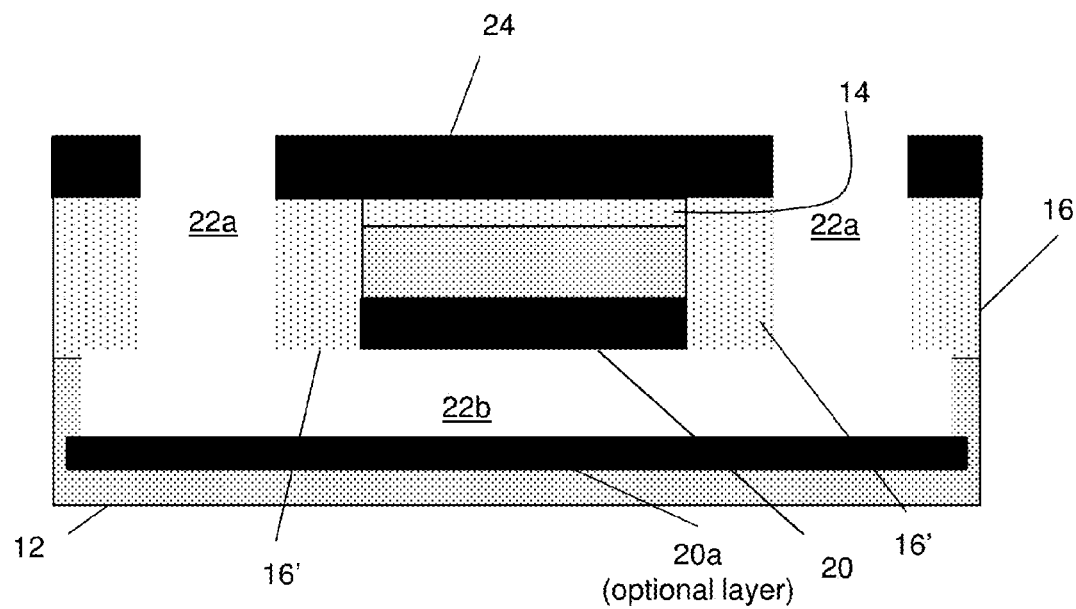

In FIG. 2, a trench 22a and undercut region 22b is formed on sides of the STI structure(s) 16' and underneath amorphous layer 20, respectively. In embodiments, the undercut portion 22b extends laterally below an active region of the yet to be formed transistor, and is of such a depth as to provide sufficient spacing to form an airgap under such transistor, e.g., about 0.5 microns to about 10 microns. As shown in FIG. 2, in an alternative or optional embodiment, an amorphous layer 20a can be provided under the undercut region 22b by performing a second, higher energy ion implantation process that the formation of the amorphous layer 20. In embodiments, the amorphous layer 20a is an optional structure which can be formed prior to or after the amorphous layer 20.

To form the trench 22a and undercut region 22b, a photoresist 24 is formed on the barrier layer 14 and the STI structures 16 (16'). The photoresist 24 is patterned to form an opening 24a. A reactive ion etch process is then performed to remove the silicon nitride later and the silicon material, thereby forming the trench 22a and undercut region 22b. In embodiments, the undercut region 22b is formed under an active region, e.g., channel, of a yet to be formed transistor. In embodiments, the wet etch process uses a chemistry which is selective to silicon, e.g., which will not attack the oxide material of the STI structure or the amorphous layer 20 (or amorphous layer 20a, in optional embodiments). For example, the wet etch process can be performed using $NH_4OH$. In this way, the amorphous layer 20 and oxide of the STI structures will act as an etch-stop layer. In addition, the photoresist 24 will protect the top portion of the wafer, e.g., nitride layer 14.

Figure 3:
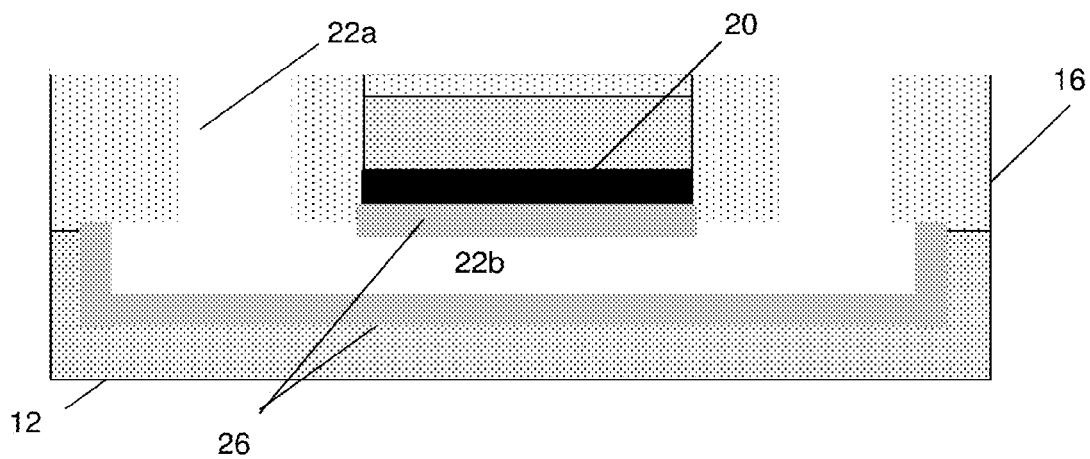

In FIG. 3, the photoresist is removed and the structure is subjected to an oxidation process to form a passivated surface 26. In embodiments, the passivated surface 26 is an oxidized surface of the substrate 12, e.g., surface of the undercut region 22b, and of the opposing amorphous layer 20.

In preferred embodiments, the passivated surface 26 is formed by a growth process using an annealing process. For example, the structure of FIG. 3 can be subjected to a high temperature anneal process at about 800° C. to about 900° C. In alternate embodiments, the structure of FIG. 3 can be subjected to a rapid thermal anneal process to form the passivated surface 26.

Figure 4:
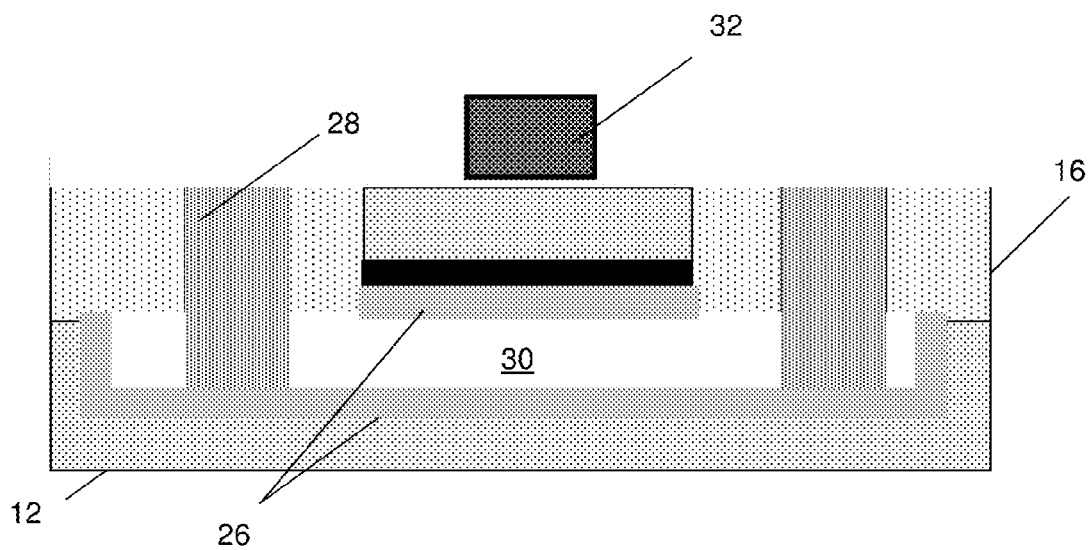

In FIG. 4, the trench 22a is closed to form an airgap 30. In embodiments, the trench is closed by the deposition of a material 28, e.g., polysilicon material. After deposition of the material 28, any residual material on the surface of the structure can be removed by a CMP process. A conventional transistor (FET) 32 is then formed over the airgap 30 using conventional deposition, lithography, etching and source/drain formation (diffusion regions on sides of a channel) processes, already known to those of skill in the art. In this way, the transistor 32 is completely isolated, e.g., oxide isolated, from portions (undoped portions) of the substrate by the STI structures and passivated surface 26, with an underlying airgap. The location of the airgap 30 is directly under and in contact with the transistor channel and source and drain regions (diffusion regions), shown representatively at reference numeral 34. The diffusion regions 34 are thus electrically isolated from the silicon substrate 12.

In alternative embodiments, additional implants can be performed at multiple energies to set a perimeter of amorphous material which will limit the extent of the undercut etch outside of trenches 22a.

Figure 5:
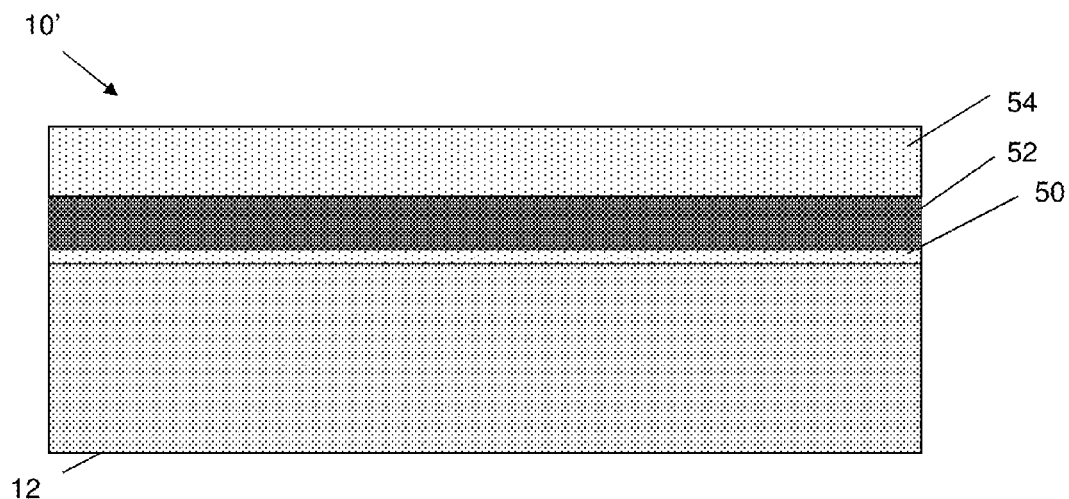
FIGS. 5-12 show respective structures and fabrication processes according to additional aspects of the present invention.

FIGS. 5-12 show respective structures and fabrication processes according to additional aspects of the present invention. In FIG. 5, the structure 10' includes a pad oxide layer 50 formed on the substrate 12. In embodiments, the pad oxide layer 50 can have a thickness of about 80 Å; although other dimensions are also contemplated by the present invention. A pad nitride layer 52 is formed on the pad oxide layer 50, which can have a thickness of about 1700 Å; although other dimensions are also contemplated by the present invention. An oxide hard mask 54 is formed on the pad nitride layer 52, which can have a thickness of about 4500 Å; although other dimensions are also contemplated by the present invention. In embodiments, the layers 50, 52, 54 can be other materials, any of which are formed using conventional deposition processes, e.g., CVD, followed by a planarization process, as appropriate, e.g., CMP, as should be understood by those of skill in the art.

Figure 6:
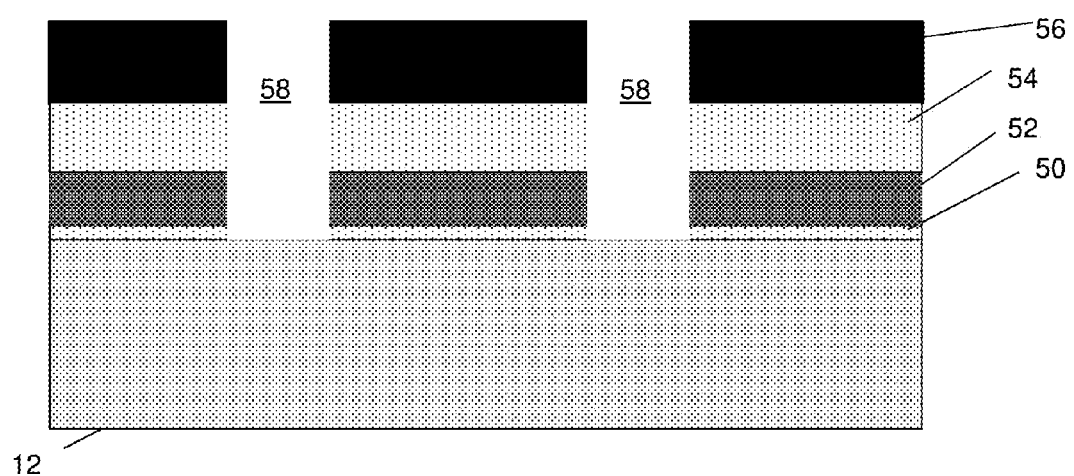

In FIG. 6, a photoresist 56 is formed on the oxide hard mask 54, which is patterned by exposure to energy (e.g., light). Opening(s) 58 are then formed in the layers 52, 54, 56, through the pattern, using conventional etching processes, e.g., RIE.

Figure 7:
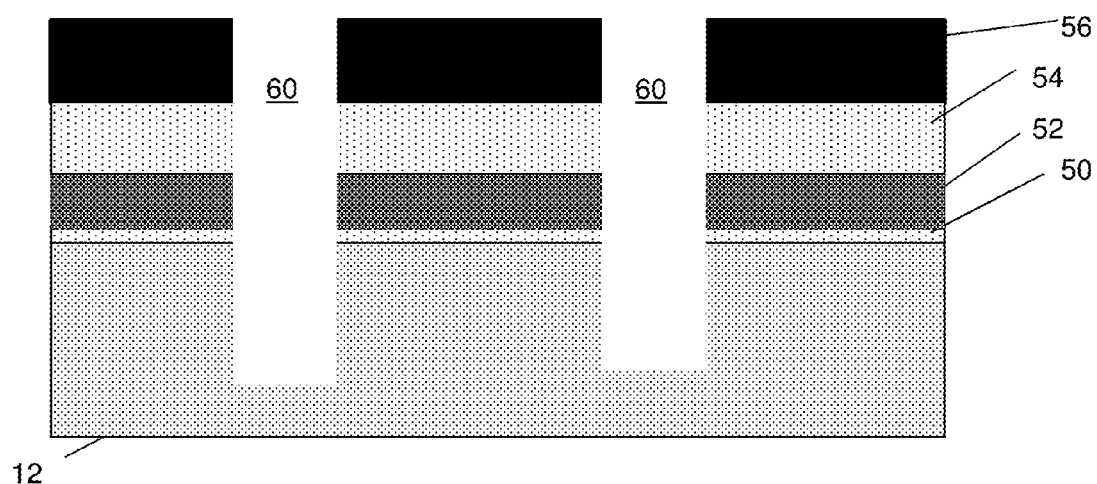

Thereafter, with an appropriate chemistry, deep trenches 60 are formed in the substrate 12, as shown in FIG. 7. In embodiments, the deep trenches 60 can be about 5000 Å to about 25000 Å in depth; although other depths are also contemplated by the present invention. For example, the depth of the deep trenches 60 are provided deep enough to isolate a channel layer (formed in the substrate) of a transistor.

Figure 8:
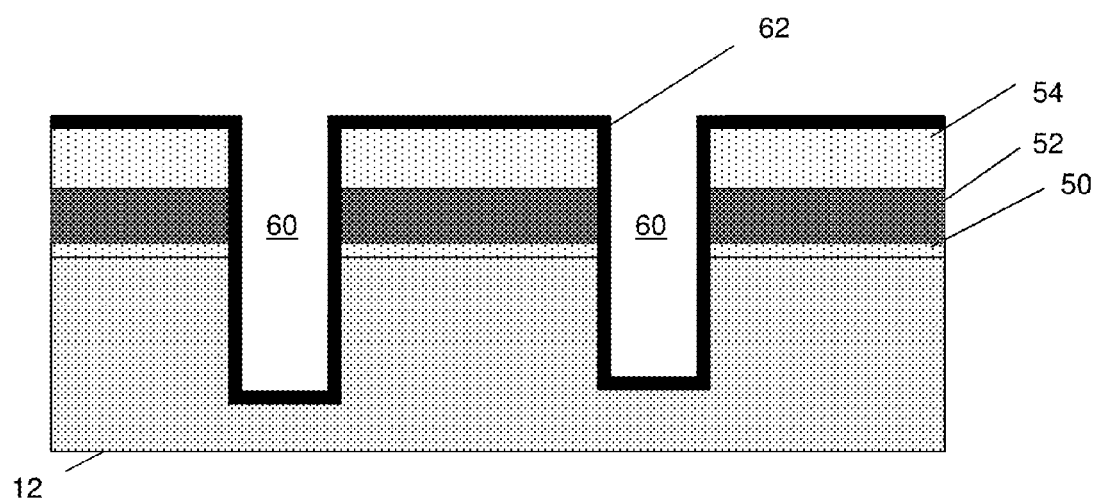

In the case of using the deep trenches 60, continuing with FIG. 8, the resist is removed and sidewall structure(s) 62 are formed in the trenches 60. In embodiments, the sidewall structure(s) 62 can be an oxide material. More specifically, in embodiments, the sidewall structure(s) 62 can be formed by an oxide deposition followed by a TEOS (Tetraethyl Orthosilicate) deposition process. In alternative embodiments, the sidewall structure(s) 62 can be formed using eDRAM collar deposition processes. In embodiments, the wall thickness of the sidewall structure(s) 62 is dependent on the dimensions of the deep trench 60; that is, the wall thickness of the sidewall structure(s) 62 should not pinch off the deep trench 60. The oxide process can be followed by an annealing process.

Figure 9:
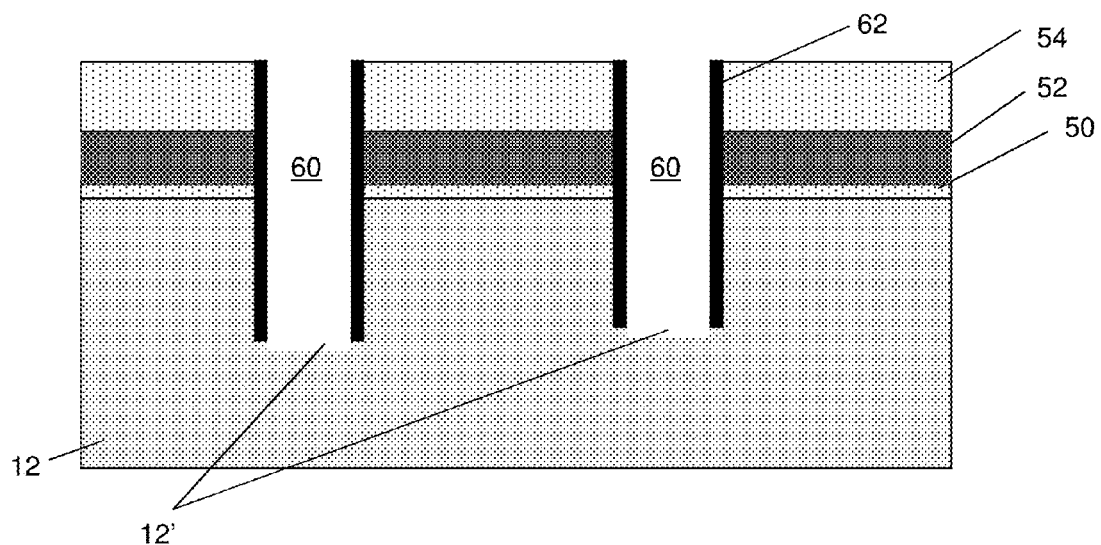

As shown in FIG. 9, the material of the sidewall structure(s) 62 at the bottom of the deep trench 60 is removed by an etching process. In embodiments, this etching process will also remove the sidewall material from a top surface of the structure, e.g., layer 54. In embodiments, the etching process is an anisotropic etching process, in order to remove the material on horizontal surfaces, leaving the sidewalls on the vertical portions on the deep trench(es).

Figure 10:
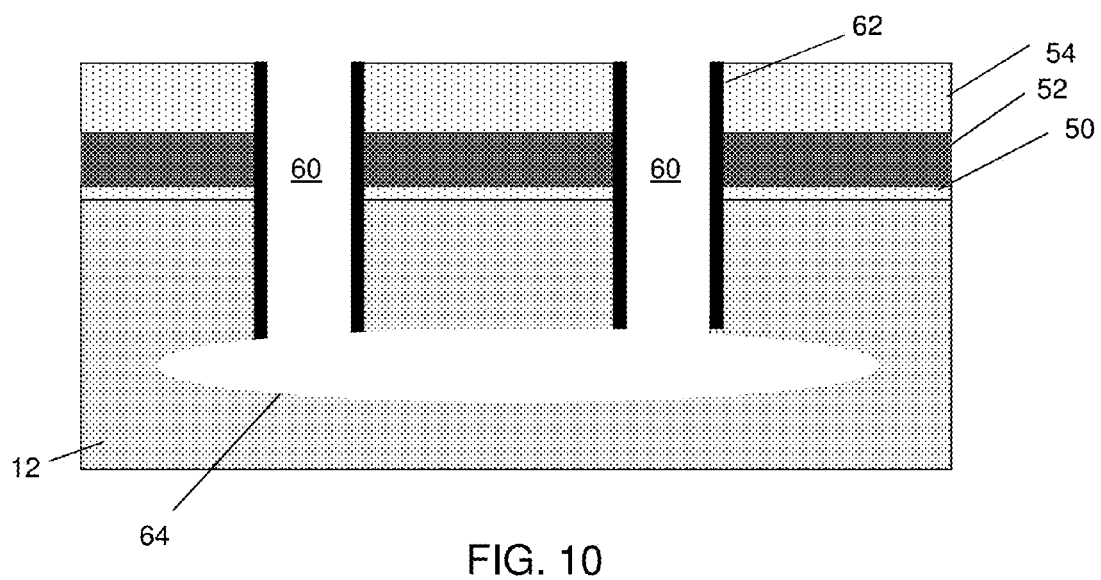

In FIG. 10, an etching or venting process is performed to form a lateral undercut 64, removing material under an active region, e.g., channel of a transistor. In embodiments, the etching process is a XeF chemistry.

Figure 11:
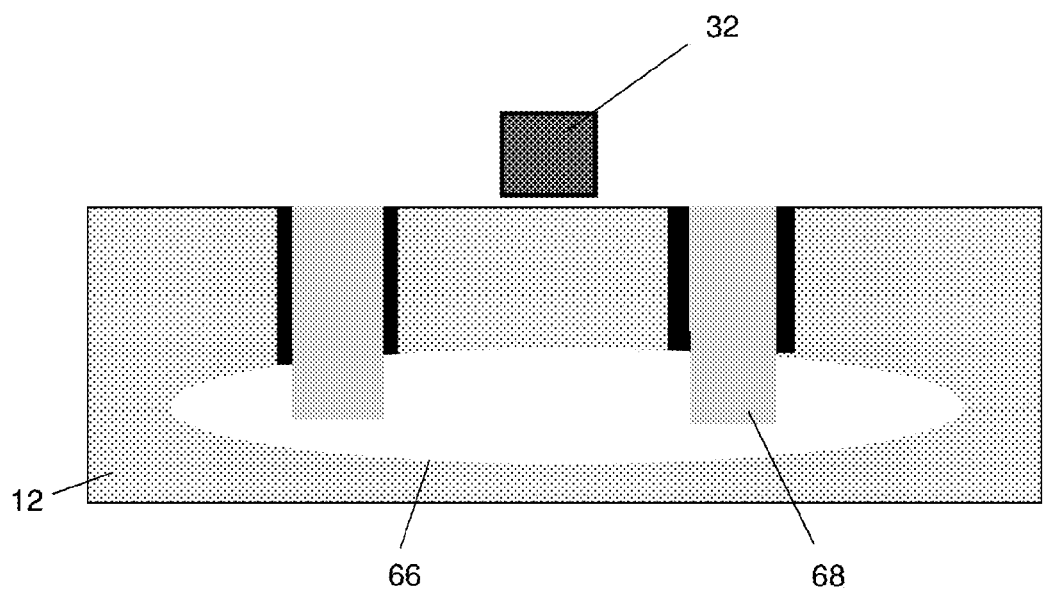

In FIG. 11, the trench 60 is closed to form an airgap 66. In embodiments, the trench is closed by the deposition of a material 68, e.g., polysilicon material. After deposition of the material 68, any residual material on the surface of the structure can be removed by a CMP process. A conventional transistor (FET) 32 is then formed over the airgap 66 using conventional deposition, lithography, etching and source/drain formation processes, already known to those of skill in the art. In this way, the transistor 32 is completely isolated.

Figure 12:
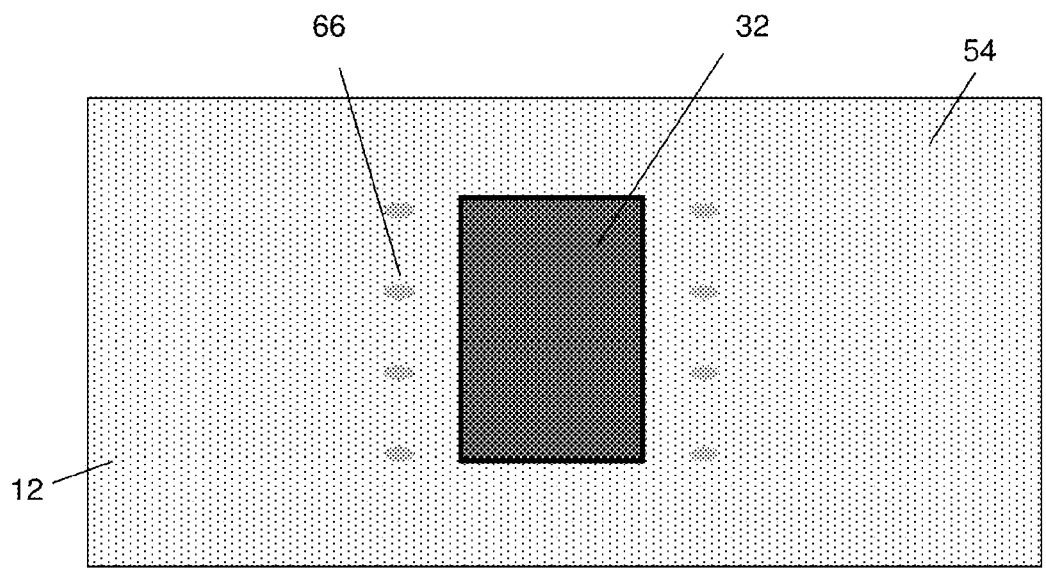

FIG. 12 shows a top view of FIG. 11. As shown in this view, the filled trenches, e.g., material 66, surround the transistor 32 such that the transistor 32 is completely isolated, with an underlying airgap. The location of the airgap 30 is directly under and in contact with the transistor channel and source and drain regions.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming a lateral undercut in a bulk substrate starting at a bottom of at least one deep trench structure;
    filling the at least one deep trench structure with material to form an airgap from the lateral undercut in the bulk substrate under the active region; and
    forming a transistor over the airgap,
    wherein the lateral undercut is formed by etching with $XeF_2$ and the material is formed directly on sidewall structures on sidewalls of the at least one deep trench structure, and
    wherein the transistor is formed as a completely isolated transistor.

2. The method of claim 1, further comprising completely filling of the at least one deep trench structure with the material to form the airgap from the lateral undercut in the bulk substrate under the active region.

3. The method of claim 2, wherein the sidewall structures comprise depositing oxide within the at least one deep trench structure and removing of the oxide from a bottom surface of the at least one deep trench structure to expose the bulk substrate for subsequent etching.

4. The method of claim 3, wherein the sidewall structures are formed prior to forming the lateral undercut in the bulk substrate.

5. The method of claim 3, further comprising removing residual material of the sidewall structures from a surface of a substrate material on the bulk substrate.

6. The method of claim 1, wherein a location of the airgap is directly under a transistor channel.

7. The method of claim 6, wherein the airgap is in contact with the transistor channel.

8. The method of claim 1, wherein the material is polysilicon material deposited within the at least one deep trench structure.

9. The method of claim 1, wherein the sidewall structures are on vertical portions of the at least one deep trench structure.

* * * * *